(12) United States Patent
Katkar et al.

(10) Patent No.: US 12,322,650 B2
(45) Date of Patent: *Jun. 3, 2025

(54) DIFFUSION BARRIER FOR INTERCONNECTS

(71) Applicant: ADEIA SEMICONDUCTOR BONDING TECHNOLOGIES INC., San Jose, CA (US)

(72) Inventors: Rajesh Katkar, Milpitas, CA (US); Cyprian Emeka Uzoh, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/822,980

(22) Filed: Sep. 3, 2024

(65) Prior Publication Data

US 2024/0429094 A1 Dec. 26, 2024

Related U.S. Application Data

(63) Continuation of application No. 18/297,829, filed on Apr. 10, 2023, now Pat. No. 12,198,981, which is a
(Continued)

(51) Int. Cl.
*H01L 21/768* (2006.01)
*H01L 21/68* (2006.01)
(Continued)

(52) U.S. Cl.
CPC ........ *H01L 21/76843* (2013.01); *H01L 21/68* (2013.01); *H01L 23/53238* (2013.01);
(Continued)

(58) Field of Classification Search
CPC ............... H01L 21/76843; H01L 21/68; H01L 23/53238; H01L 24/09; H01L 21/76831;
(Continued)

(56) References Cited

U.S. PATENT DOCUMENTS

| | | | |
|---|---|---|---|
| 5,753,536 | A | 5/1998 | Sugiyama et al. |
| 5,755,859 | A | 5/1998 | Brusic et al. |

(Continued)

FOREIGN PATENT DOCUMENTS

| | | | |
|---|---|---|---|
| CN | 106298527 A | | 1/2017 |
| FR | 3025051 A1 | | 2/2016 |

(Continued)

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

(Continued)

*Primary Examiner* — Thanh Y. Tran
(74) *Attorney, Agent, or Firm* — Knobbe, Martens, Olson & Bear, LLP

(57) ABSTRACT

Representative implementations of techniques and devices are used to reduce or prevent conductive material diffusion into insulating or dielectric material of bonded substrates. Misaligned conductive structures can come into direct contact with a dielectric portion of the substrates due to overlap, especially while employing direct bonding techniques. A barrier interface that can inhibit the diffusion is disposed generally between the conductive material and the dielectric at the overlap.

30 Claims, 8 Drawing Sheets

Related U.S. Application Data continuation of application No. 17/313,185, filed on May 6, 2021, now Pat. No. 11,694,925, which is a continuation of application No. 16/143,850, filed on Sep. 27, 2018, now Pat. No. 11,031,285.

(60) Provisional application No. 62/569,232, filed on Oct. 6, 2017.

(51) Int. Cl.
*H01L 23/00* (2006.01)
*H01L 23/532* (2006.01)
*H01L 25/00* (2006.01)
*H01L 25/065* (2023.01)

(52) U.S. Cl.
CPC .......... *H01L 24/09* (2013.01); *H01L 25/0657* (2013.01); *H01L 25/50* (2013.01); *H01L 2224/08237* (2013.01); *H01L 2225/06513* (2013.01); *H01L 2924/37001* (2013.01)

(58) Field of Classification Search
CPC ......... H01L 24/06; H01L 24/08; H01L 24/05; H01L 2224/039; H01L 2224/0603; H01L 2224/08145; H01L 2224/08146; H01L 2224/08235; H01L 2224/08237
See application file for complete search history.

(56) References Cited

U.S. PATENT DOCUMENTS

| | | |
|---|---|---|
| 5,771,555 A | 6/1998 | Eda et al. |
| 6,080,640 A | 6/2000 | Gardner et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,750,488 B2 | 7/2010 | Patti et al. |
| 7,803,693 B2 | 9/2010 | Trezza |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,780,035 B1 | 10/2017 | Briggs et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,727,122 B2 | 7/2020 | Backes et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |

(56) References Cited

U.S. PATENT DOCUMENTS

| | | |
|---|---|---|
| 11,387,214 B2 | 7/2022 | Wang et al. |
| 11,393,779 B2 | 7/2022 | Gao et al. |
| 11,462,419 B2 | 10/2022 | Haba |
| 11,476,213 B2 | 10/2022 | Haba et al. |
| 11,515,291 B2 | 11/2022 | DeLaCruz et al. |
| 11,694,925 B2 * | 7/2023 | Katkar ............... H01L 25/0657 257/751 |
| 12,198,981 B2 * | 1/2025 | Katkar ............. H01L 21/76843 |
| 2003/0186543 A1 | 10/2003 | Jiang et al. |
| 2004/0084414 A1 | 5/2004 | Sakai et al. |
| 2006/0057945 A1 | 3/2006 | Hsu et al. |
| 2007/0105366 A1 | 5/2007 | Aubel et al. |
| 2007/0111386 A1 | 5/2007 | Kim et al. |
| 2008/0054444 A1 | 3/2008 | Tuttle |
| 2010/0078770 A1 | 4/2010 | Purushothaman et al. |
| 2010/0155951 A1 | 6/2010 | Koike et al. |
| 2011/0084403 A1 | 4/2011 | Yang et al. |
| 2012/0045893 A1 | 2/2012 | Koerner |
| 2012/0094469 A1 | 4/2012 | Landru |
| 2012/0196442 A1 | 8/2012 | Deng |
| 2012/0202348 A1 | 8/2012 | Tomiyama et al. |
| 2013/0009321 A1 | 1/2013 | Kagawa et al. |
| 2013/0011938 A1 | 1/2013 | Tsao et al. |
| 2013/0014978 A1 | 1/2013 | Uzoh et al. |
| 2013/0122719 A1 | 5/2013 | De Vries |
| 2013/0207271 A1 | 8/2013 | Hagimoto et al. |
| 2014/0021614 A1 | 1/2014 | Yu et al. |
| 2014/0011754 A9 | 5/2014 | Cai et al. |
| 2014/0117546 A1 | 5/2014 | Liu et al. |
| 2014/0175655 A1 | 6/2014 | Chen et al. |
| 2014/0264948 A1 | 9/2014 | Chou et al. |
| 2015/0021789 A1 | 1/2015 | Lin |
| 2015/0064498 A1 | 3/2015 | Tong |
| 2015/0108644 A1 | 4/2015 | Kuang et al. |
| 2015/0243611 A1 | 8/2015 | Liu et al. |
| 2015/0262976 A1 | 9/2015 | Edelstein et al. |
| 2015/0371953 A1 | 12/2015 | Yu et al. |
| 2016/0013160 A1 | 1/2016 | Chun et al. |
| 2016/0118335 A1 | 4/2016 | Lee et al. |
| 2016/0141202 A1 | 5/2016 | Xue et al. |
| 2016/0141249 A1 | 5/2016 | Kang et al. |
| 2016/0190066 A1 | 6/2016 | Lin et al. |
| 2016/0197049 A1 | 7/2016 | Chen et al. |
| 2016/0336231 A1 | 11/2016 | Tsai et al. |
| 2016/0343682 A1 | 11/2016 | Kawasaki |
| 2016/0343762 A1 | 11/2016 | Kagawa et al. |
| 2018/0138224 A1 | 5/2018 | Haneda |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204868 A1 | 7/2018 | Kuo et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0109042 A1 | 4/2019 | Katkar et al. |
| 2019/0115277 A1 | 4/2019 | Yu et al. |
| 2019/0122931 A1 | 4/2019 | Huang et al. |
| 2019/0131277 A1 | 5/2019 | Yang et al. |
| 2019/0333550 A1 | 10/2019 | Fisch |
| 2019/0385935 A1 | 12/2019 | Gao et al. |
| 2020/0013765 A1 | 1/2020 | Fountain, Jr. et al. |
| 2020/0035641 A1 | 1/2020 | Fountain, Jr. et al. |
| 2020/0194396 A1 | 6/2020 | Uzoh |
| 2020/0294908 A1 | 9/2020 | Haba et al. |
| 2020/0328162 A1 | 10/2020 | Haba et al. |
| 2020/0395321 A1 | 12/2020 | Katkar et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0159117 A1 | 5/2021 | Wang et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0265200 A1 | 8/2021 | Kagawa et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0271117 A1 | 8/2022 | Leng |
| 2022/0285303 A1 | 9/2022 | Mirkarimi et al. |
| 2022/0310446 A1 | 9/2022 | Chung et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0360968 A1 | 11/2023 | Katkar et al. |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |

(56) References Cited

U.S. PATENT DOCUMENTS

| | | |
|---|---|---|
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |

FOREIGN PATENT DOCUMENTS

| | | |
|---|---|---|
| JP | H0629718 A | 2/1994 |
| JP | 2013-033786 A | 2/2013 |
| JP | 2017-135247 A | 8/2017 |
| JP | 2018-160519 | 10/2018 |
| KR | 10-2013-0007972 | 1/2013 |
| KR | 10-2016-0108784 | 9/2016 |
| WO | WO 2005/043584 A2 | 5/2005 |
| WO | WO 2016/152513 A1 | 9/2016 |
| WO | WO 2021/242321 A1 | 12/2021 |

OTHER PUBLICATIONS

Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.

Moriceau, H. et al., "Overview of recent direct wafer bonding advances and applications," Adv Nat Sciences: Nanoscience and Nanotechnology, Dec. 2010;1(4):043004; 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412.

ONSEMI AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the BUSH article share the part number "ONSEMI AR0820.".

OmniVision OV20880 Press Release, "OmniVision Announces New Family of 20-Megapixel PureCel® Plus-S Sensors for High-End Smartphones," www.prnewswire.com/news-releases/omnivision-announces-new-family-of-20-megapixel-purecelplus-s-sensors-for-high-end-smartphones-300358733.html (Nov. 7, 2016), downloaded May 31, 2024; 3 pages.

OmniVision OV20880 Images, cross-section and EDX material analysis of hybrid bonded image sensor product. The part in the images was shipped Sep. 3, 2021. The first image is a cross section showing hybrid bonded parts; the second image is an EDX materials analysis taken through dielectrics on either side of the bond interface; the third image is an EDX materials analysis taken through metal parts on either side of the bond interface. Applicant makes no representation that the part in the images is identical to the part identified in the separately submitted reference Omnivision OV20880 Press Release (dated Nov. 7, 2016); however, the imaged part and the part shown in Omnivision OV20880 Press Release share the part name "Omnivision OV20880."

Plössl, A. et al., "Wafer direct bonding: tailoring adhesion between brittle materials," Materials Science and Engineering: R: Reports. Mar. 10, 1999;25(1-2):1-88.

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

Yang, Chih-Chao et al., "Co Capping Layers for Cu/Low-k Interconnects," IBM Research, AMC, Albany, NY, Oct. 5-7, 2010, 16 pages.

Chinese Office Action mailed Nov. 30, 2023, Chinese Application No. 201880055006.5, 11 pages.

Supplementary European Search Report in EP 18864135, dated Apr. 28, 2021.

Extended European Search Report for EP Appl. No. 18864135.1, mailed May 10, 2021, 10 pages.

Extended European Search Report for EP Appl. No. 22166588.8, mailed Oct. 31, 2022, 12 pages.

Korean Notice of Final Rejection, in KR 10-2020-7007913, dated Jan. 10, 2022.

International Search Report and Written Opinion dated Feb. 1, 2019, for PCT Application No. PCT/US2018/053736, 10 pages.

Bao et al., Mechanistic Study of Plasma Damage of Low k Dielectric Surfaces. J Vac Sci Technol B: Jan. 1, 2008;26(1): 219-226.

Chen et al., Low-Temperature Remote Plasma Enhanced Atomic Layer Deposition of $ZrO_2$/Zircone Nanolaminate Film for Efficient Encapsulation of Flexible Organic Light-Emitting Diodes. Sci Reports. Jan. 6, 2017;7(1): 40061; 9 pages.

Cheng et al., "Plasma Damage on Low-k Dielectric Materials". Vienna, Austria: In Tech Open; Nov. 5, 2018; Chapter 15: 28 pages; http://dx.doi.org/10.5772/intechopen.79494.

Groner et al., "Low-Temperature Al2O3 Atomic Layer Deposition". Chem Materials. Feb. 24, 2004;16(4): 639-645.

Zhu et al., Low-Temperature Plasma-Enhanced Atomic Layer Deposition of $SiO_2$ Using Carbon Dioxide. Nanoscale Research Letters. Dec. 2019;14: 1-8.

\* cited by examiner

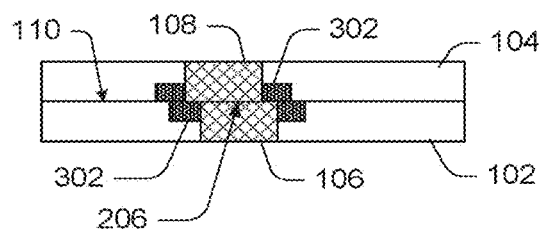
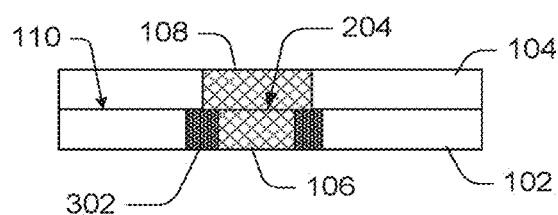
FIG. 4A  FIG. 4B
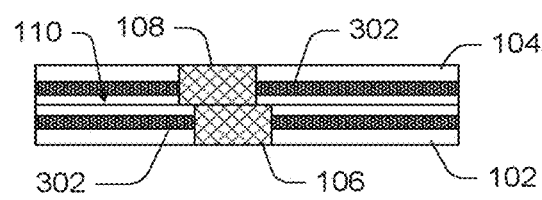
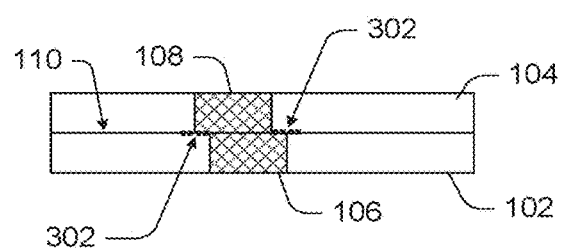
FIG. 4C  FIG. 4D
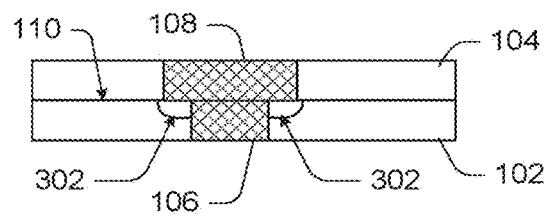
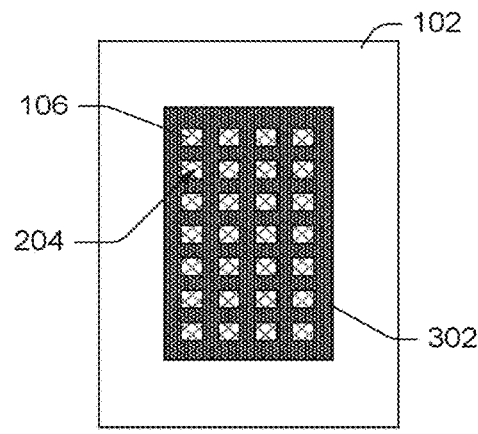
FIG. 4E  FIG. 4F

DIFFUSION BARRIER FOR INTERCONNECTS

PRIORITY CLAIM AND CROSS-REFERENCE TO RELATED APPLICATION

This application is a continuation of U.S. patent application Ser. No. 18/297,829, filed Apr. 10, 2023, which is a continuation of U.S. patent application Ser. No. 17/313,185, filed May 6, 2021, now U.S. Pat. No. 11,694,925, which is a continuation of U.S. patent application Ser. No. 16/143,850, filed Sep. 27, 2018, now U.S. Pat. No. 11,031,285, which claims the benefit under 35 U.S.C. § 119 (e) (1) of U.S. Provisional Application No. 62/569,232, filed Oct. 6, 2017, each of which are hereby incorporated by reference in their entirety.

FIELD

The following description relates to processing of integrated circuits ("ICs"). More particularly, the following description relates to techniques for processing dies or wafers in preparation for bonding.

BACKGROUND

Dies or wafers, and the like, may be stacked in a three-dimensional arrangement as part of various microelectronic packaging schemes. This can include stacking one or more dies or wafers on a larger base die or wafer, stacking multiple dies or wafers in a vertical arrangement, and various combinations of these. Dies may be stacked on wafers or wafers may be stacked on other wafers prior to singulation. The dies or wafers may be bonded in a stacked arrangement using various bonding techniques, including using direct dielectric bonding, non-adhesive techniques, such as a ZiBond® direct bonding technique or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety).

When bonding stacked dies or wafers using a direct bonding technique, it is desirable that the surfaces of the dies or wafers to be bonded be extremely flat and smooth. For instance, the surfaces should have a very low variance in surface topology, such that the surfaces can be closely mated to form a lasting bond. It is also desirable that the surfaces be clean and free from impurities, particles, and/or other residue. The presence of undesirable particles for instance, can cause the bond to be defective or unreliable at the location of the particles. For instance, some particles and residues remaining on bonding surfaces can result in voids at the bonding interfaces between the stacked dies.

Respective mating surfaces of the bonded dies or wafers often include embedded conductive interconnect structures, or the like. In some examples, the bonding surfaces are arranged and aligned so that the conductive interconnect structures from the respective surfaces are joined during the bonding. The joined interconnect structures form continuous conductive interconnects (for signals, power, etc.) between the stacked dies or wafers. However, due to the use of fine pitch conductive interconnect structures, the placement accuracy limitations of pick-and-place tools, contact grid patterns on the die or wafer surfaces, dissimilar pad sizes, and the like, a conductive interconnect pad of one die or wafer may be offset, or partially overlay the dielectric portion (e.g., silicon oxide, etc.) of the mating surface of the other die or wafer, rather than perfectly aligning with the respective conductive interconnect pad on the mating surface of the other die or wafer.

Misalignment such as this can cause the conductive material (e.g., copper, or the like) of the overlaying interconnect pad to diffuse into the dielectric that it comes into contact with, potentially resulting in degraded performance of the microelectronic structure. For example, the barrier properties of silicon oxide can degrade significantly (versus silicon nitride, silicon oxinitride, silicon carbonitride, etc.) at higher temperatures (such as during annealing) and within an electric field, promoting the diffusion of the conductive material into the silicon oxide. This can result in leakage, shorting between interconnects, and the like. The performance degradation can be particularly problematic when it involves multiple conductive interconnect structures of bonded stacks of dies or wafers, which can adversely affect package yield and package performance.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIGS. 4A-4E are profile views showing example barrier interfaces employed with stacked substrates having embedded conductive structures, according to additional embodiments.

FIG. 4F is a plan view showing an example barrier interface with multiple embedded conductive structures, according to an embodiment.

SUMMARY

Figure 1:
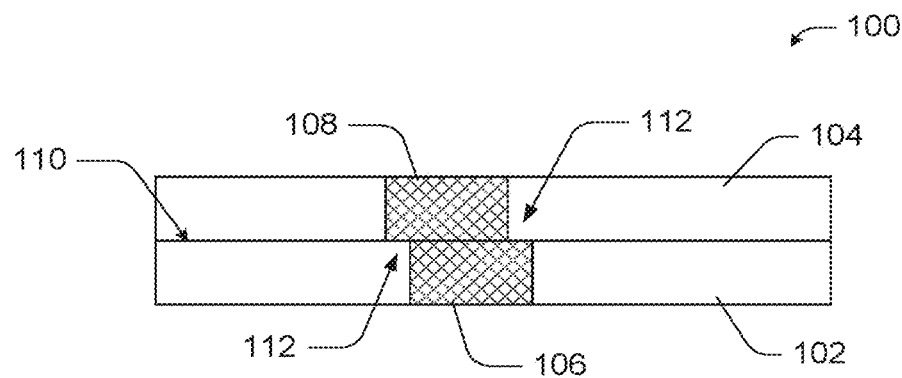
FIG. 1 is a profile view of a pair of stacked substrates showing a misalignment of embedded conductive structures within the stacked substrates.

Various embodiments of devices and techniques reduce or prevent conductive material diffusion into insulating material or dielectric of bonded substrates. Particularly, the devices and techniques disclosed herein mitigate undesirable diffusion due to misaligned conductive structures on the bonding surfaces of the substrates. The misaligned conductive structures can otherwise come into direct contact with a dielectric portion of the surfaces of the substrates due to overlap, especially while employing direct bonding techniques.

The devices and techniques comprise the use of a barrier interface disposed generally between the conductive material and the dielectric that can inhibit the diffusion of the conductive layer into surrounding dielectric materials.

The substrates may be dies, wafers, carriers, large flat panels, or the like, comprised of a semiconductor or a non-semiconductor material. Semiconductor materials may, for example, comprise direct band gap or indirect band gap semiconductors and their combinations thereof. Non-semiconductor materials may comprise, for example, a dielectric material for example, glass, ceramic, silicon oxycarbides, silicon oxide, or the like, or combinations thereof. The use of the term "substrate" herein is intended to include all of these and other like examples.

In an embodiment, a microelectronic assembly can include at least a first substrate having a first substantially planar surface, the first substrate comprising an insulating material or dielectric, for example. The dielectric may be provided on a base die or wafer of semiconductor, insulating, or conductive material. A second substrate has a first substantially planar surface, the second substrate also comprising an insulating material or dielectric, for instance. The dielectric may be provided on a base die or wafer of semiconductor, insulating, or conductive material. The materials of the first substrate may be the same (or similar) material of the second substrate. However, in an alternate embodiment, the materials of the first substrate is a different material than the material of the second substrate. The first surface of the second substrate is bonded to the first surface of the first substrate without an intervening material such as an adhesive.

A first conductive interconnect structure is embedded in the first substrate (or in a layer of the first substrate), a surface of the first conductive interconnect structure being exposed through the first surface of the first substrate to form a first interconnect pad. A second conductive interconnect structure is embedded in the second substrate (or in a layer of the second substrate), a surface of the second conductive interconnect structure being exposed through the first surface of the second substrate to form a second interconnect pad. The first interconnect pad faces, and may contact a portion of the first surface of the first substrate and the second interconnect pad faces, and may contact a portion of the first surface of the second substrate. In one implementation, the second interconnect pad is directly bonded to the first interconnect pad.

In various examples, the second interconnect pad may be misaligned with respect to the first interconnect pad, resulting in some overlap of the first and/or second interconnect pads over the insulating material or dielectric of the opposite substrate.

In the embodiment, a first barrier interface is disposed at the first substrate and at least partially surrounds a perimeter of the first interconnect pad. The first barrier interface comprises a material different from the insulating material or dielectric of the first substrate and is arranged to inhibit a diffusion of a material of the second conductive interconnect structure into the first substrate. In the embodiment, the material of the first barrier interface is also a different material than the material of the second conductive interconnect structure. In one implementation, the first barrier interface comprises an air gap, a roughened surface, or the like.

In another embodiment, the microelectronic assembly also includes a second barrier interface disposed at the second substrate. The second barrier interface at least partially surrounds a perimeter of the second interconnect pad and comprises a material different from the insulating material or dielectric of the second substrate. The second barrier interface is arranged to inhibit a diffusion of a material of the first conductive interconnect structure into the second substrate. In one implementation, the second barrier interface comprises an air gap, a roughened surface, or the like.

In some embodiments, the first and/or second barrier interfaces may comprise multiple materials or may comprise multiple portions comprised of one or more materials. In other embodiments, the first and/or second barrier interfaces may comprise a combination of materials, air gaps, roughened surfaces, and the like.

In various embodiments, the first or second barrier interfaces may partially or fully surround multiple interconnect pads of their respective substrates. Alternatively, multiple barrier interfaces may partially or fully surround one or more interconnect pads of the first or second substrates.

In some embodiments, the first or second barrier interfaces can also mitigate or prevent dielectric erosion (e.g., rounding) that can occur at the perimeter of a conductive interconnect structure during planarization, or the like.

Some of the disclosed processes may be illustrated using block flow diagrams, including graphical flow diagrams and/or textual flow diagrams. The order in which the disclosed processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Implementations are explained in more detail below using a plurality of examples. Although various implementations and examples are discussed here and below, further implementations and examples may be possible by combining the features and elements of individual implementations and examples.

DETAILED DESCRIPTION

Overview

FIG. 1 is a profile view of a pair of stacked substrates 102 and 104 showing a misalignment of embedded conductive structures 106 and 108 within the stacked substrates 102 and 104, respectively. The substrates 102 and 104 are comprised of an insulating material or dielectric (e.g., silicon oxide, or the like), at least at the bonding surface of each substrate 102 and 104. For example, substrates 102 and 104 can represent the top insulating layer of a microelectronic component comprised of a base layer (of active semiconductor, e.g., silicon, or the like) topped with one or more metallization layers within associated insulating layers. In some cases, substrate 102 may be significantly larger than substrate 104. In one example, substrate 104 may comprise a die having a width between 1 to 30 mm or even larger, while substrate 102 may comprise another die (for example) that is larger than substrate 104, a larger substrate such as a flat panel, a 200 or 300 mm wafer, or the like.

Prior to bonding, the portions of the embedded conductive structures 106 and 108 that are exposed through the bonding surfaces of the substrates 102 and 104 may form interconnect pads, or the like. In an example, the substrates 102 and 104 are bonded at respective bonding surfaces, and the conductive structures 106 and 108 are electrically coupled, and generally are also mechanically bonded to form a single (continuous) conductive structure. The bond-line 110 indicates where the bonding surfaces of the substrates 102 and 104 are joined.

In an example, bonding the substrates 102 and 104 forms a microelectronic assembly 100. For instance, the substrates 102 and 104 may be direct bonded, including using a hybrid bonding technique, without using intervening materials such as adhesives. Prior to bonding, the conductive structures 106 and 108 may be slightly recessed below the surface of the substrates 102 and 104, to prepare for metal expansion. The surfaces of the substrates 102 and 104 are bonded via direct bonding (e.g., via Zibond™), dielectric to dielectric at room temperature without the use of adhesive. Then with high temperature annealing (<350 C), the contact pads 106 and 108 expand and form a metal-to-metal bond creating an electrical connection. After the bonding operations, for example when the substrates 102 and 104 comprise wafers, the bonded assembly 100 may be tested for known good dies prior to segmentation, to separate into various bonded substrates or dies.

As shown in FIG. 1, due to one or more of various reasons discussed above, including the inaccuracy (or tolerance) of the pick-and-place tool used to bond substrate 104 to substrate 102, the conductive structures 106 and 108 may be misaligned when the substrates 102 and 104 are placed together and bonded. The offset 112 of the misalignment comprises an overlap of the interconnect pad 106 beyond a perimeter or edge of the interconnect pad 108 and/or an overlap of the interconnect pad 108 beyond the perimeter or edge of the interconnect pad 106. Due to the offset 112, a portion of one or both of conductive structures 106 and 108 may contact the insulating material of substrates 104 and 102 respectively. As discussed above, the conductive material (e.g., copper or a copper alloy, etc.) of one or both of the conductive structures 106 and 108 may diffuse into the insulating material or dielectric of the substrates 104 and 102 due to this contact. Additionally, some process elements (such as high temperature annealing, for instance) or operational parameters (e.g. high frequency electric field, etc.) can exacerbate the diffusion of the conductive material into the insulating material or dielectric of the substrates 104 and 102 inducing undesirable leakage in the dielectric layer for example.

Figure 2:
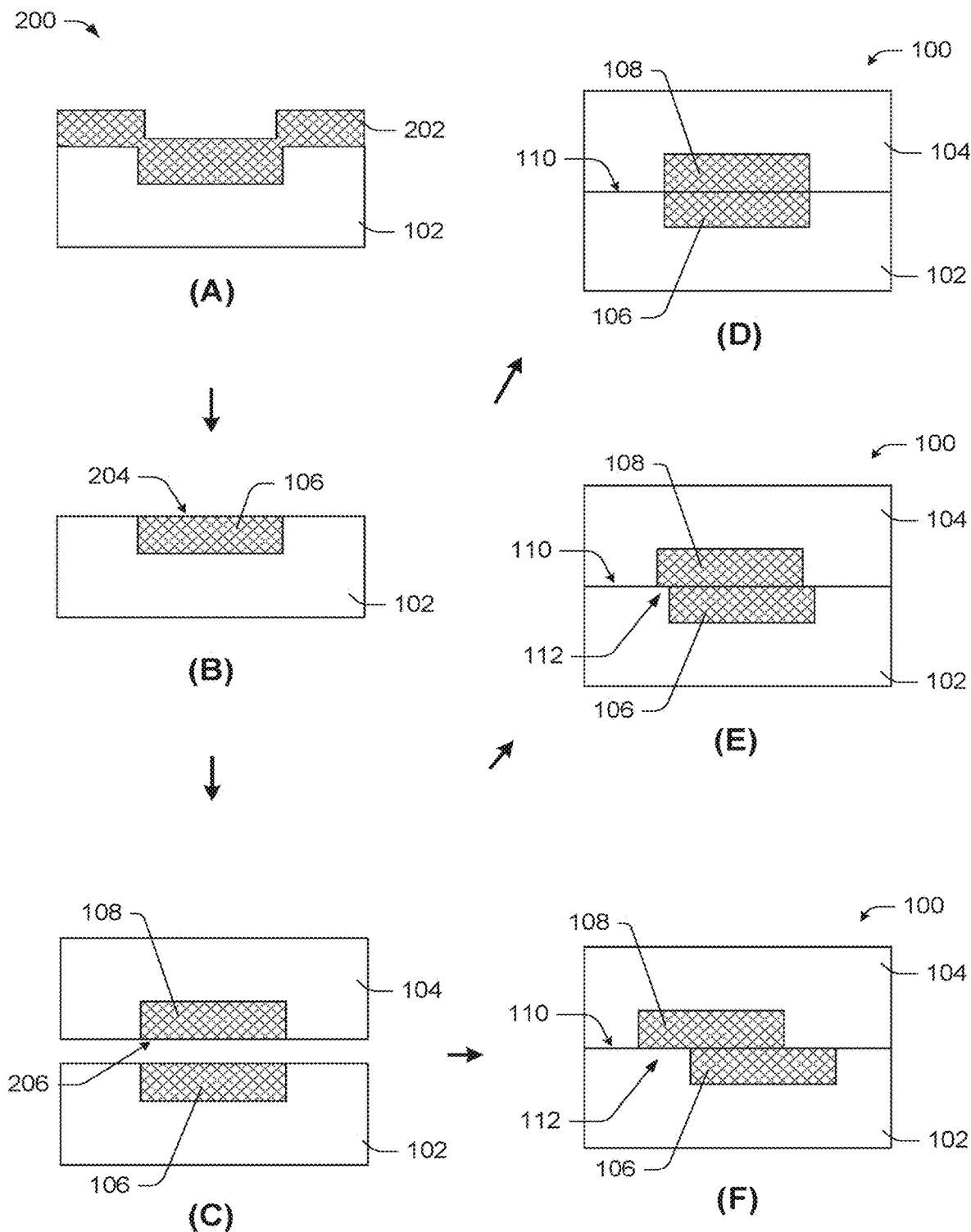
FIG. 2 is a graphical flow diagram illustrating an example process of forming a microelectronic assembly comprising a pair of substrates with embedded conductive structures.

FIG. 2 is a graphical flow diagram illustrating an example process 200 of forming a microelectronic assembly 100 comprising a pair of substrates 102 and 104 with embedded conductive structures 106 and 108, according to an embodiment. In an example, a damascene structure is formed from a substrate 102. At block (A), a conductive material 202 (e.g., copper, a copper alloy, nickel or nickel bearing conductor, or the like) is deposited over a surface of the substrate 102, including into the damascene cavity, filling the cavity. At block (B), the conductive material 202 is planarized (e.g., via chemical mechanical polishing (CMP), etching, etc.) to form the conductive structure 106. The exposed portion of the conductive structure 106 may comprise an interconnect pad 204. In one embodiment it may be preferable that the interconnect pad 204 be slightly recessed below the bonding surface of the substrate 102. The bonding surface is prepared by cleaning methods to remove defects inducing undesirable particles, residual organic material and their likes. The cleaned surface or surfaces may be prepared by exposing one or more of the surfaces to nitrogen plasma in preparation for the bonding process.

At block (C), a similar damascene structure is formed from another substrate 104, which, after planarization, includes a conductive structure 108. The exposed portion of the conductive structure 108 may comprise an interconnect pad 206. The prepared bonding surface of the substrate 104 is placed over and stacked onto the substrate 102 in preparation for bonding. The assembled substrates 102 and 104 are then thermally treated at a temperature below 350° C. and preferably below 250° C., for enough time for the bonding surfaces to bond permanently and for the opposing conductive materials to couple both mechanically and electrically.

Blocks (D), (E), and (F) show three potential outcomes of bonding substrate 102 to substrate 104. Block (D) represents an ideal scenario, where the conductive structures 106 and 108 are aligned well, without offset. Block (E) represents an average scenario where there is an average misalignment of the conductive structures 106 and 108, based on an average inaccuracy (e.g., tolerance) of the placement tool used to bond the substrate 104 to the substrate 102. Block (F) represents an extreme scenario where there is an extreme misalignment of the conductive structures 106 and 108, based on a maximum inaccuracy (e.g., tolerance) of the placement tool used to bond the substrate 104 to the substrate 102. Typically, the higher placement speed of the pick and place tool, the lower is its placement accuracy, i.e. larger the offset. For applications with extremely small interconnect pad sizes, the placement tool can slow down dramatically to improve the placement accuracy, which affects throughput.

As discussed above, the offset 112 (shown at blocks (E) and (F)) provides an opportunity for diffusion of the conductive materials of conductive structures 106 and 108 into the insulating material or dielectric of substrates 104 and 102, respectively.

Example Barrier Interface

According to this disclosure, to avoid the diffusion of copper into oxide, for instance, a barrier interface 302 comprising a dielectric bonding layer, conductive barrier layer, or other barrier can be applied around the interconnect pads 106 and/or 108 to form a barrier against diffusion. The barrier interface 302 material is selected such that the diffusivity of the conductive materials of conductive structures 106 and 108 (copper, for instance) into the barrier materials is worse as compared to that of the insulating material or dielectric of the substrates 104 and 102 (e.g., silicon oxide). In various embodiments, the barrier materials may include conductive or non-conductive materials with preselected diffusivity characteristics.

Figure 3A:
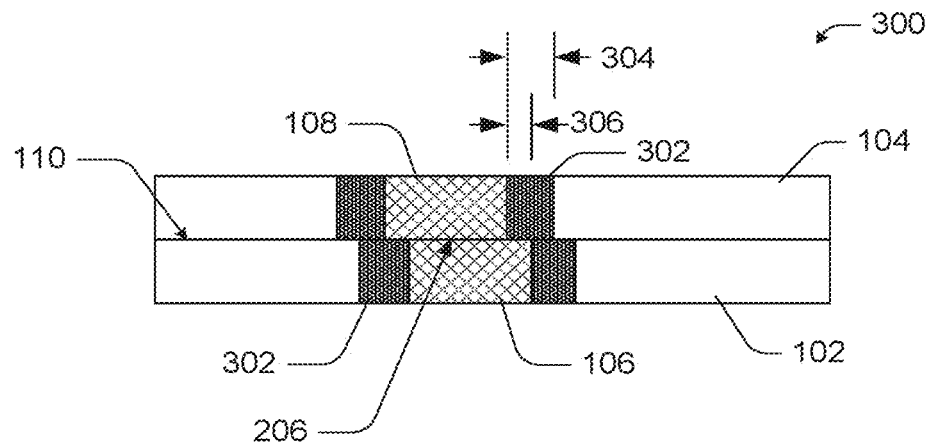
FIGS. 3A and 3B are profile views showing example barrier interfaces employed with stacked substrates having embedded conductive structures, according to various embodiments.
Figure 3B:
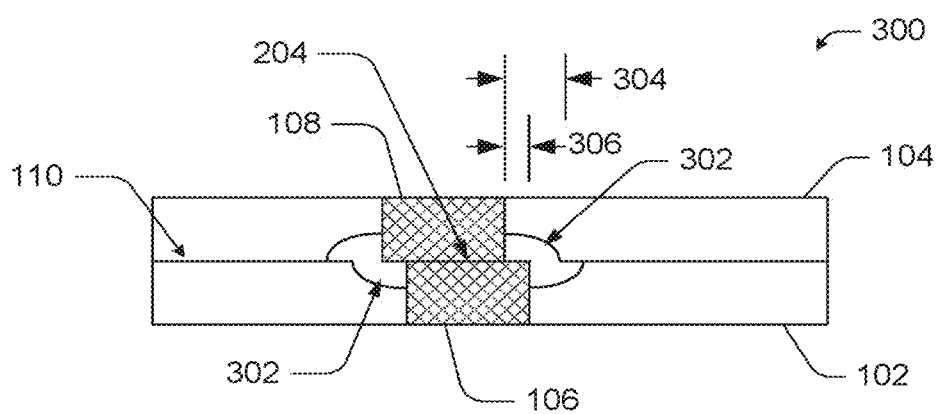

FIGS. 3A and 3B are profile views showing examples of a barrier interface 302 employed with stacked substrates 102 and 104 having embedded conductive structures 106 and 108, according to various embodiments. In an implementation, the substrates 102 and 104 are directly bonded without an intervening material such as an adhesive, to form a microelectronic assembly 300. In the implementation, the microelectronic assembly 300 comprises a microelectronic assembly 100 as discussed above and includes one or more barrier interfaces 302 on one or both of the substrates 102 and 104. In an alternate implementation, the microelectronic assembly 300 includes more than two substrates (such as substrates 102 and 104) in the bonded stack, with one or more of the substrates of the stack including one or more barrier interfaces 302. In another implementation, the microelectronic assembly 300 includes two or more substrates (such as substrates 102 and 104) bonded separately to another substrate or a wafer, with two or more of the substrates including one or more barrier interfaces 302.

In an implementation, the barrier interface(s) 302 of the assembly 300 are disposed at one or both of the substrates 102 and 104, and at least partially surround a perimeter of the interconnect pads 204 and/or 206, and/or the embedded conductive structures 106 and 108, respectively. As shown at FIG. 3A, the barrier interface(s) 302 may comprise one or more materials different from the insulating material or dielectric of the substrate 102 and/or the substrate 104. For example, the barrier interface(s) 302 may comprise a dielectric material different from the insulating material or dielectric of the substrate 102 and/or the substrate 104. In various implementations, the barrier interface(s) 302 comprise one or more of silicon nitride, silicon oxynitride, silicon carbide, silicon carbonitride, diamond, boron doped glass or oxide, aluminum oxide, or a like diffusion resistant material. In other implementations, the barrier interface(s) 302 comprise nickel, a nickel alloy, or one or more other conductive materials in various combinations.

Additionally, employing a barrier interface 302 can include techniques to prevent diffusion by avoiding bonding at the relevant bonding interface. For example, in various embodiments, the respective conductive interconnect structures 106 and 108 may be bonded, but little or none of the immediately surrounding insulating material or dielectric is bonded. As shown at FIG. 3B, one or more of the barrier interface(s) 302 may comprise a recess, an air gap, or a gas-filled cavity, or the like. Again, the barrier interface(s) 302 comprise a different material from the insulating material or dielectric of the substrate 102 and/or the substrate 104. In various implementations, the barrier interface(s) 302 comprise an inert gas or fluid, a preselected gas or fluid (based on desired properties), vacuum, or the like. The air gap barrier interface 302 may be formed by etching, making undercuts in the substrate 102 and/or 104, dishing the substrate 102 and/or 104 via CMP, grinding, substrate rounding near substrate and interconnect pad interface during CMP, or the like, and so forth.

Referring to FIGS. 3A and 3B, in the implementations, the barrier interface(s) 302 are arranged to inhibit a diffusion of the material of the conductive interconnect structures 106 and 108 into the substrates 104 and 102, respectively. For example, the material of the barrier interface(s) 302 is selected such that a diffusivity of the material of the conductive interconnect structure 106 or a diffusivity of the material of the conductive interconnect structure 108 into the material of the barrier interface(s) 302 of the substrate 104 or the substrate 102 is less than a diffusivity of the material of the conductive interconnect structures 106 or 108 into the material of the substrate 104 or the substrate 102 (e.g., silicon oxide).

In various embodiments, one or more of the barrier interfaces 302 can be arranged to fully surround or encompass the conductive structures 106 and/or 108 and/or their respective interconnect pads 204 and/or 206 (i.e., the mating surface of the conductive structures 106 and 108, respectively), or to partially surround the conductive structures 106 and/or 108 and/or their respective interconnect pads 204 and/or 206, forming a barrier against the diffusion of the conductive material (e.g., copper) into the material (e.g., silicon oxide) of the substrates 102 and 104.

As shown in FIGS. 3A and 3B, in various embodiments, a barrier interface 302 has a thickness (i.e., width, extent, etc.) 304 that is greater than the placement accuracy 306 of the pick-and-place tool (also represented by the overlap 112 in FIG. 1). This thickness of the barrier interface 302 ensures that the material of the conductive structures 106 and 108 will contact the barrier interface 302 rather than the substrate 104 or 102 in case of maximum placement misalignment. This ensures that any conductive material overlap occurs at the barrier interface 302, and not at the substrate material (e.g., silicon oxide), thus preventing diffusion. Additionally, this significantly relaxes the placement accuracy requirements of the pick and place tool, which can improve the throughput, especially in a die to die and die to wafer bonding process.

Accordingly, in one embodiment, a relative lateral displacement of one interconnect pad 204 (of conductive structure 106) to the other interconnect pad 206 (of conductive structure 108) is less than a width of one or more of the barrier interfaces 302. Further, in one implementation, a width of one or more of the barrier interfaces 302 is at least 10% of a diameter of the interconnect pads 204 and/or 206 of the conductive structures 106 and/or 108. In other implementations, the width of one or more of the barrier interfaces Is at least 20% of the diameter of the interconnect pads 204 and/or 206.

As shown in FIG. 3B, in some embodiments, at least some portion of the pad 204 extends or protrudes beyond a recessed surface of the insulating material of the substrate 102 on the microelectronic assembly 300 after bonding, and may extend beyond the bond line 110. This extension may be a result of forming the barrier interface 302, it may be the result of dielectric erosion (i.e., rounding) on the surface of the substrate 102 around the periphery of pad 204 from planarizing, or both, or the result of other causes separately or in combination. A like extension or protrusion of at least some portion of the pad 206 past the recessed surface of the substrate 104 after bonding, and perhaps an extension past the bond line 110, may also be present in the embodiments.

In any case, a result of the extension of the pad 204 and/or the pad 206 is an air gap at least partially surrounding the pad 204 and/or the pad 206 (intentional or otherwise). In some cases, when the interconnect pads 204 and 206 are misaligned (as shown in FIG. 3B), only a partial extension or protrusion of at least some portion of the pad 204 or 206 past the bond line 110, may be present in some embodiments.

In FIG. 3A, a relative lateral displacement of one interconnect pad 204 (of conductive structure 106) to the other interconnect pad 206 (of conductive structure 108) is less than a width of one or more of the barrier interfaces 302. During the annealing process, as the conductive pads 204/

206 expand more than the substrate material 102/104 and the barrier interface material 302, this high mismatch between the coefficients of thermal expansion may induce debonding of the portion of substrate 102 from the substrate 104 at the location as the pads 204/206 push the barrier interface 302. In an implementation, the debonding may be mitigated (e.g., reduced or eliminated) by adjusting the annealing times and temperatures. In the implementation, the bonding surfaces may be heat treated at around 100-150° C. for 2 to 4 hours to form a strong bond between the substrates 102 and 104. The pads 204 and 206 may then be annealed during a second heat treatment using a pulse anneal technique at approximately 250-400° C. for 10 seconds to less than 300 seconds. In an example, the pulse anneal times for the second heat treatment are less than 10% of the heating time for the first heat treatment. In the implementation, the adjusted heating/annealing times are effective to reduce or eliminate the mismatch stress or load of the bonded microelectronic assembly 300.

While FIGS. 3A and 3B show conductive structures extending through substrates 102 and 104, the structures may extend partially through the substrate or layers on the substrate. Specific details of the conductive connections on, in, or though the substrate are not shown in FIGS. 3-7 for simplicity and in order to focus on the structures, or portions of the structure, at the bond interface.

FIGS. 4A-4E are profile views showing additional example barrier interfaces 302 employed with stacked substrates 102 and 104 having embedded conductive structures 106 and 108, according to additional embodiments. As shown at FIGS. 3A and 4A, a barrier interface 302 may be embedded into one or more of the substrates 102 and/or 104. In an embodiment, as shown in FIGS. 3A and 4A, one or more barrier interfaces 302 is embedded in a substrate 102 and/or 104 and extends into the substrate 102 and/or 104 to a depth less than or equal to a depth of a conductive structure 106 or 108. In this configuration, the substrates 102 and 104 are protected from conductive material diffusion. In an embodiment, as shown at FIGS. 3A and 4A, the barrier interface 302 may be disposed (and may be exposed) at the bonding surface of a substrate 102 and/or 104, and may extend a predetermined depth into the substrate 102 and/or 104.

As shown in FIG. 4B, a barrier interface 302 may be used on one of the substrates 102 or 104 when conductive structures 106 and 108 are dissimilar sizes. For example, the barrier interface 302 (at an advantageous thickness) may be used on the smaller of the conductive structures 106 and 108, to protect for diffusion from the larger of the conductive structures 106 and 108, with no exposed overlap onto the substrates 102 or 104. For instance, in an embodiment, the width of the first interconnect pad 106 is less than the width of the second interconnect pad 108, and the barrier interface 302 is disposed at the first substrate 102, at least partially surrounding the perimeter of the first interconnect pad 106. The barrier interface 302 thickness/width is such that the combined width of the first interconnect pad 106 and the barrier interface 302 is greater than the width of the second interconnect pad 108. In other words, as with each of the embodiments, at least one of the perimeter edges of the second interconnect pad 108 is within the perimeter of the barrier interface 302. The other perimeter edge of the second interconnect pad 108 is also within the perimeter of the barrier interface 302 or within the perimeter of the first interconnect pad 106 (preventing diffusion into substrate material).

As shown in FIG. 4C, an embedded barrier interface 302 may or may not be exposed at the bonding surface of the substrates 102 and 104. The barrier interface 302 may be disposed a preselected distance below the bonding surface, and may have various depth and thickness (i.e., width or extents). For example, in one embodiment, the barrier interface 302 can extend across the width of the substrate 102 or 104. The barrier interface 302 can abut the conductive structures 106 and/or 108, and diffusion may be limited to the area of the substrates 102 and 104 above the barrier interface 302, the barrier interface 302 preventing diffusion below the barrier interface 302. In some embodiments, such a barrier interface 302 may be comprised of a polymeric layer, or like material with a desired diffusivity characteristic.

As shown in FIG. 4D, the barrier interface 302 may comprise a rough area of the bonding surface of the substrate 102 and/or 104, which may include one or more gaps in the bond between the substrates 102 and 104 at a predetermined width. For instance, a highly planar bonding surface with low variance in topology is generally prepared on both substrates 102 and 104 in order to have a reliable direct bond between the substrates 102 and 104. In an embodiment, however, the surface area of the substrates 102 and/or 104 partially or fully around the conductive structures 106 and/or 108 may have a higher roughness (greater variance in surface topology) to create uneven or irregular surfaces between the substrates 102 and 104, to reduce or eliminate the bond at that area of the substrates 102 and 104. For example, the roughness can make the surface insufficiently smooth (or leave not enough surface contact) to form a bond. The high roughness (e.g., greater than 10 nm variance) barrier interface 302 can be formed with etching, cutting, grinding, selective CMP, or the like.

Similarly to the embodiment described with regard to FIG. 4B, as shown at FIG. 4E, the barrier interface 302 may be used on one of the substrates 102 and 104 when the conductive structures 106 and 108 are dissimilar sizes. In the case of FIG. 4E, the barrier interface 302 comprises an air gap (or a fluid-filled gap) used with the smaller of the conductive structures 106 and 108. When the barrier interface 302 is sized advantageously, there is no overlap of conductive material onto the substrates 102 or 104, and thus no diffusion. For instance the air-gap barrier interface 302 may be sized so that any offset between the interconnect pads 204 and 206, effectively the edges of the interconnect pads 204 and 206, falls within the barrier interface 302 and not at the material of the substrates 102 and 104.

In an implementation, one or more barrier interfaces 302 comprises a combination including two or more of: a plurality of air gaps, one or more materials different from the insulating or dielectric material of the substrates 102 and 104, and a roughened surface of a predetermined width.

As shown in the plan view of FIG. 4F, in an embodiment, a plurality of conductive structures 106 (or interconnect pads 204) may be partially or fully surrounded or encompassed by a single barrier interface 302. In such an embodiment, the substrate 102 may be bonded to another substrate 104 having a plurality of conductive structures 108, or more than one substrate with conductive structures.

Figure 5A:
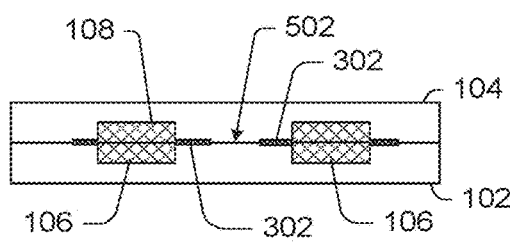
FIGS. 5A-5C are profile views showing example barrier interfaces employed with stacked substrates having embedded conductive structures, according to additional embodiments.
Figure 5B:
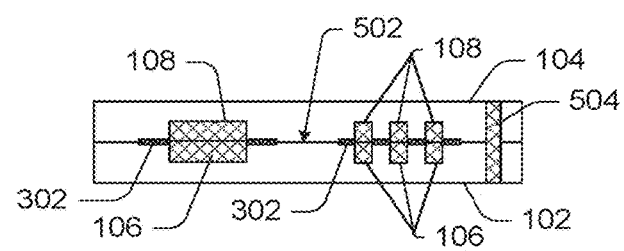
Figure 5C:
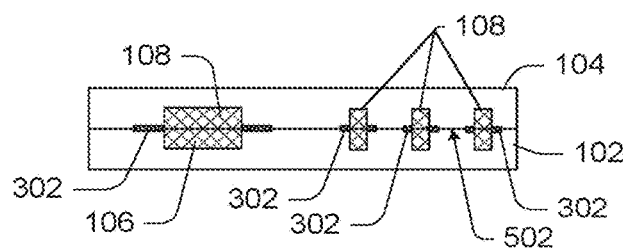

Alternately, multiple barrier interfaces 302 may partially or fully surround one or more conductive structures 106, 108 or interconnect pads 204, 206 of one or more of the substrates 102 and 104. For example, as shown in FIGS. 5A-5C, multiple conductive structures 106 and 108 are partially or fully surrounded by barrier interfaces 302. For instance, in an embodiment, a plurality of additional conductive interconnect structures 106 are embedded in the substrate 102, where a surface of each of the additional conductive interconnect structures 106 is exposed through the bonding surface of the substrate 102 to form a plurality of additional interconnect pads 204. A plurality of additional conductive interconnect structures 108 are embedded in the opposite substrate 104, and a surface of each of the additional conductive interconnect structures 108 is exposed through the bonding surface of the substrate 104 to form a plurality of additional interconnect pads 206.

A barrier interface 302 at least partially surrounds at least a subset of the group of pads including the first interconnect pad 106 and the plurality of additional interconnect pads 106. The barrier interface 302 is arranged to inhibit diffusion of the conductive material of the group of interconnect structures including the conductive interconnect structure 108 and the plurality of additional conductive interconnect structures 108 into the substrate 102, based on the position and the composition of the barrier interface 302. Further, the barrier interface(s) 302 may also be arranged to inhibit diffusion of the conductive material of the group of interconnect structures including the conductive interconnect structure 106 and the plurality of additional conductive interconnect structures 106 into the substrate 104.

As shown in FIGS. 5A and 5C, each of multiple conductive structures 106 and 108 may include a barrier interface 302. For instance, in an embodiment, one or more additional barrier interfaces 302 are disposed at the substrate 102 and/or the substrate 104 that at least partially surround a perimeter of one or more additional subsets of the first interconnect pad 106 and the plurality of additional interconnect pads 106, and/or the second interconnect pad 108 and the plurality of additional interconnect pads 108. The one or more additional barrier interfaces 302 comprise a material different from the insulating material or dielectric of the substrate 102 and/or the substrate 104, and are arranged to inhibit diffusion of the material of the group of interconnect structures including the conductive interconnect structure 108 and the plurality of additional conductive interconnect structures 108 into the material of the substrate 102, based on the position and the composition of the barrier interfaces 302. Further, the one or more additional barrier interfaces 302 can be arranged to inhibit diffusion of the material of the group of interconnect structures including the conductive interconnect structure 106 and the plurality of additional conductive interconnect structures 106 into the material of the substrate 104.

Referring to FIGS. 5A-5C, in some embodiments, between each barrier interface 302 may be a gap 502, which may be a space between the barrier interfaces 302, a gas-filled gap, or the like. The gap 502 forms a physical separation between the bonding surfaces of the substrates 102 and 104, at least around the periphery of the conductive structures 106 and/or 108.

In some embodiments, the combination of the barrier interfaces 302 and the gap(s) 502 prevent or reduce diffusion of the conductive material of the conductive structures 106 and/or 108, and their respective interconnect pads 204 and 206, into the material of the substrates 104 and 102. In another embodiment, no such gap 502 is formed between the bonding surfaces of the substrates 102 and 104. Alternately, as shown in FIG. 5B, single conductive structures 106 and/or 108, as well as groups of two or more conductive structures 106 and/or 108 may be partially or fully surrounded by single barrier interfaces 302. Between barrier interfaces 302 there may or may not be a gap 502, as described above. A via (e.g., TSV), such as the via 504 may be present in any of the embodiments discussed herein, including the example embodiment shown at FIG. 5B. The via 504 may extend to the outer extents (e.g., exposed surfaces) of one or both of the substrates 102 and 104 (and beyond), or it may extend some fractional portion through the substrate 102 and/or the substrate 104.

Example Processes

Figure 6:
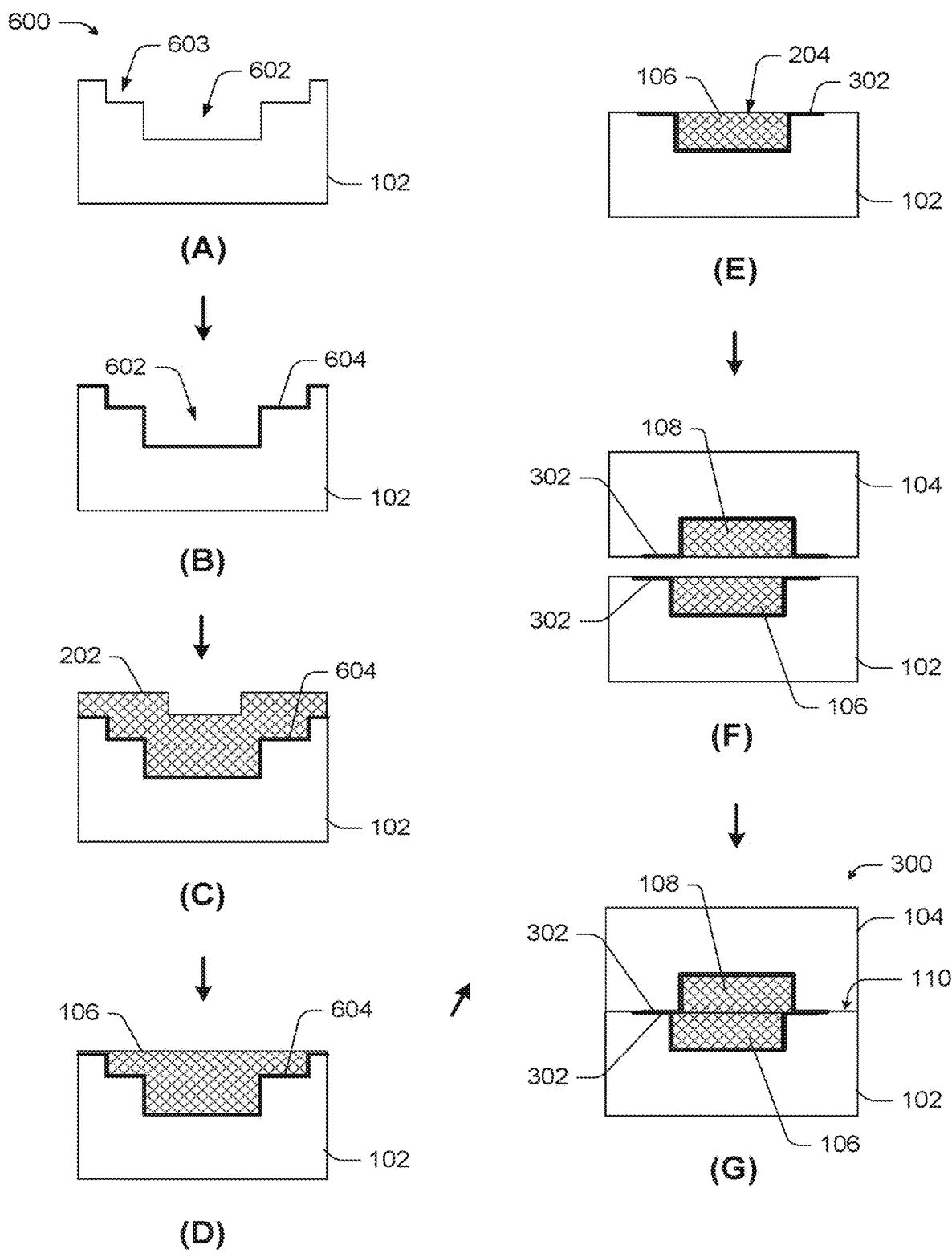
FIG. 6 is a graphical flow diagram illustrating an example process of forming a microelectronic assembly comprising a pair of substrates with embedded conductive structures with a barrier interface, according to an embodiment.

FIG. 6 is a graphical flow diagram illustrating an example process 600 of forming a microelectronic assembly 300 comprising a pair of substrates 102 and 104 with embedded conductive structures 106 and 108 and one or more barrier interfaces 302, according to an embodiment.

At block A, the method includes forming a cavity 602 (or a plurality of cavities 602 and 603) in a surface of the substrate 102. The cavities 602 and 603 may be formed by patterned etching, or the like. In an embodiment, one of the cavities 603 may extend to a depth of less than 5% of a depth of the other cavity 602. At block B, a barrier layer 604 is formed on the surface of the substrate 102 and within the cavity 602. The barrier layer 604 may be comprised of silicon nitride, silicon oxynitride, silicon carbide, silicon carbonitride, diamond, boron doped glass or oxide, aluminum oxide, or other suitable material with worse diffusivity properties than silicon oxide, or a combination thereof, for instance. In other embodiments, the barrier layer 604 may comprise a conductive material, for example titanium or tantalum or their corresponding nitrides, nickel and nickel alloys, or other conductive materials and combinations.

At block C, the cavity 602 coated with the barrier layer 604 is filled with the conductive material 202, such as copper, a copper alloy, or the like. This could be done using a duel damascene process, for instance. In some examples it may be desirable for the conductive structure 106 to contact the bottom of the cavity 602, at the substrate 102 rather than the barrier layer 604. In these examples, portions of the barrier layer 604 may be removed from the bottom portion (and/or any other desired portion) of the cavity 602 to expose the substrate 102 prior to filling the cavity 602 with the conductive material 202.

At block D, overflow conductive material 202 is removed, by etching, CMP, or the like, stopping at the barrier layer 604, to form a conductive structure 106 (or multiple conductive structures 106) within the barrier layer 604. At block E, the conductive structure 106 and part of the barrier layer 604 are planarized via CMP, for example, to form a barrier interface 302 partly or fully surrounding an interconnect pad 204, which may have a very small recess, and a substantially planar surface (having a smooth surface topography with a variance of no more than 10-20 nm) of the substrate 102.

In some embodiments, the barrier layer 604 or barrier interface 302 is useful to prevent or to mitigate erosion of the insulating material or dielectric of the substrate 102 (e.g., rounding) that can occur during planarization. For instance, the barrier layer 604 may extend a predetermined extent (i.e., width, diameter, etc.) beyond the conductive structure 106 and over the surface of the substrate 102, protecting the surface of the substrate 102 during planarization. In other words, the first barrier interface 302 is disposed over at least a portion of the substantially planar surface of the first substrate 102, and is arranged to protect the substantially planar surface from erosion due to planarization or polishing of the substantially planar surface. With the barrier interface 302 in place, no dielectric erosion (e.g., rounding) may occur at the intersection of the conductive structure 106 and the substrate 102, or at the intersection of the barrier interface 302 and the substrate 102. In some examples, the barrier interface 302 may be used as an indicator for polishing the substrate 102, and in some examples the barrier interface 302 may be polished a desired amount as well to achieve a flat, smooth bonding surface.

At block F, a like microelectronic structure, with prepared substrate 104, conductive structure 108, and barrier layer 302 is placed onto the substrate 102 for bonding. At block G, the substrate 104 is direct bonded to the substrate 102 without an intervening material, such as adhesive, to form the microelectronic assembly 300. In particular, the substrate 104 is bonded to the bonding surface of the substrate 102 and to the barrier layer 302 on the substrate 102, and the substrate 102 is bonded to the bonding surface of the substrate 104 and to the barrier layer 302 on the substrate 104. At this step, the conductive structures 106 from the substrate 102 and the conductive structures 108 from the substrate 104 can be slightly recessed below the bond-line 110 due to CMP process and may not be in physical contact. In some cases, the conductive structure 108 may be bonded to the conductive structure 106 via heated annealing, or the like. After annealing at high temperature as discussed earlier, the conductive structure 108 is mated to the conductive structure 106 to form electrical connectivity.

Any offset of the conductive structure 106 to the conductive structure 108 due to misalignment rests on the barrier interface 302 rather than on the substrates 102 and 104. Accordingly, diffusion of conductive material (e.g., copper) into substrate 102 and/or 104 material (e.g., silicon oxide) is reduced or eliminated due to the barrier interface(s) 302.

In another embodiment, after planarization at block E of FIG. 6, an additional layer, typically of the same type of material as the substrate 102, e.g. silicon oxide, is deposited over the interconnect pad 204 and the barrier layer 302. This is followed by another planarization process, e.g. CMP, to remove excess substrate material and to achieve a surface in which the barrier layer 302 is flush with the surface of the substrate 102 surrounding it. The barrier layer 302 partially or fully surrounds the interconnect 204 and the substrate layer 102 fully or partially surrounds the barrier layer 302. In the embodiment, during block G, the direct bonding of the bonding layers of 102 and 104 occurs along with the direct bonding of the barrier layer 302 of the substrate 102 with the barrier layer 302 of the substrate 104. This is followed by the annealing step, wherein the conductive structure 108 may be bonded to the conductive structure 106 via heated annealing, or the like.

Figure 7:
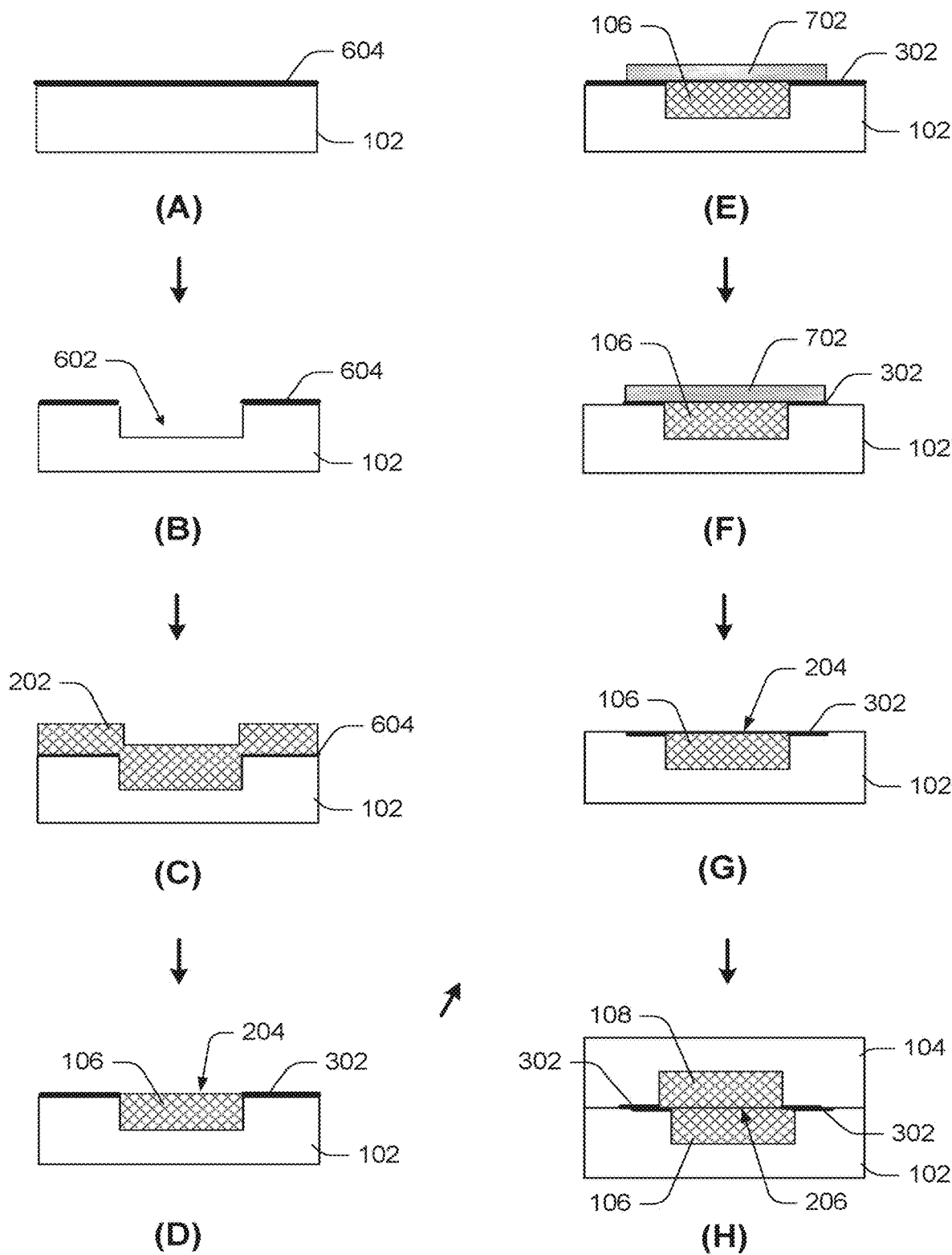
FIG. 7 is a graphical flow diagram illustrating an example process of forming a microelectronic assembly comprising a pair of substrates with embedded conductive structures with a barrier interface, according to another embodiment.

FIG. 7 is a graphical flow diagram illustrating an example process 700 of forming a microelectronic assembly 300 comprising a pair of substrates 102 and 104 with embedded conductive structures 106 and 108 and one or more barrier interfaces 302, according to another embodiment.

At block A, the method includes depositing the barrier layer material 604 onto the surface of an oxide or other dielectric (for example) substrate 102. At block B, a portion of the barrier layer 604 and a portion of the dielectric of the substrate 102 are removed, and the resulting cavity 602 is filled with a conductive material 202 (at block C). In some embodiments, the process of forming the conductive material 202 in the cavity 602 may include coating a second barrier (not shown) over the surface of the first barrier layer 604 and the cavity 602 before filling the cavity 602 with the conductive material 202.

At block D, a conductive structure 106 with interconnect pad 204 surrounded by a barrier interface 302 is formed by planarizing the conductive material 202, and the second barrier layer if present. In an implementation, the barrier interface 302 is efficacious to prevent dielectric erosion of the substrate 102 at the intersection of the conductive structure 106 during the planarizing. In an embodiment, this structure 102 with prepared barrier interface 302 and conductive structure 106 may be bonded to another like structure, but without the barrier interface 302 on the other structure. In such an embodiment, the barrier layer 302 can act as a bonding surface for the other structure, based on the material used for the barrier layer (e.g., silicon nitride, or the like).

At block E, if desired, the barrier interface 302 can be altered to remove any unwanted portions. A resist, mask, or other pattern 702 may be deposited, and the barrier interface 302 etched as desired (at block F). Additional substrate material (such as silicon oxide, for example) can be deposited onto the surface of the substrate 102 to prepare the surface for bonding. For instance, the added material may be deposited while the mask 702 is still in place, or after removing the mask 702. The surface of the substrate 102 is then planarized (via CMP, or the like) to achieve a flat, smooth surface including the surface of the substrate 102 flush with the barrier interface 302, in preparation for bonding.

At block G, a prepared substrate 102 is shown with an interconnect pad 204 having a partially or fully encompassing barrier interface 302. Two similarly prepared substrates 102 and 104 may be stacked and bonded at their planarized surfaces to form a microelectronic structure 300, as shown at block H. Any overlap of conductive material occurs at the barrier interface(s) 302 rather than at the dielectric of the substrates 102 and/or 104. This method can also be used to form multiple conductive interconnect structures 106, 108 with barrier interface(s) 302 partially or fully surrounding the multiple conductive interconnect structures 106, 108.

In an alternative implementation, the conductive structures 106 and/or 108 may include conductive mechanical pads. In the implementation, the mechanical pads mate intimately with the barrier layer 302 or the substrate 102/104 to secure the mechanical pads to the substrate 102/104.

Figure 8:
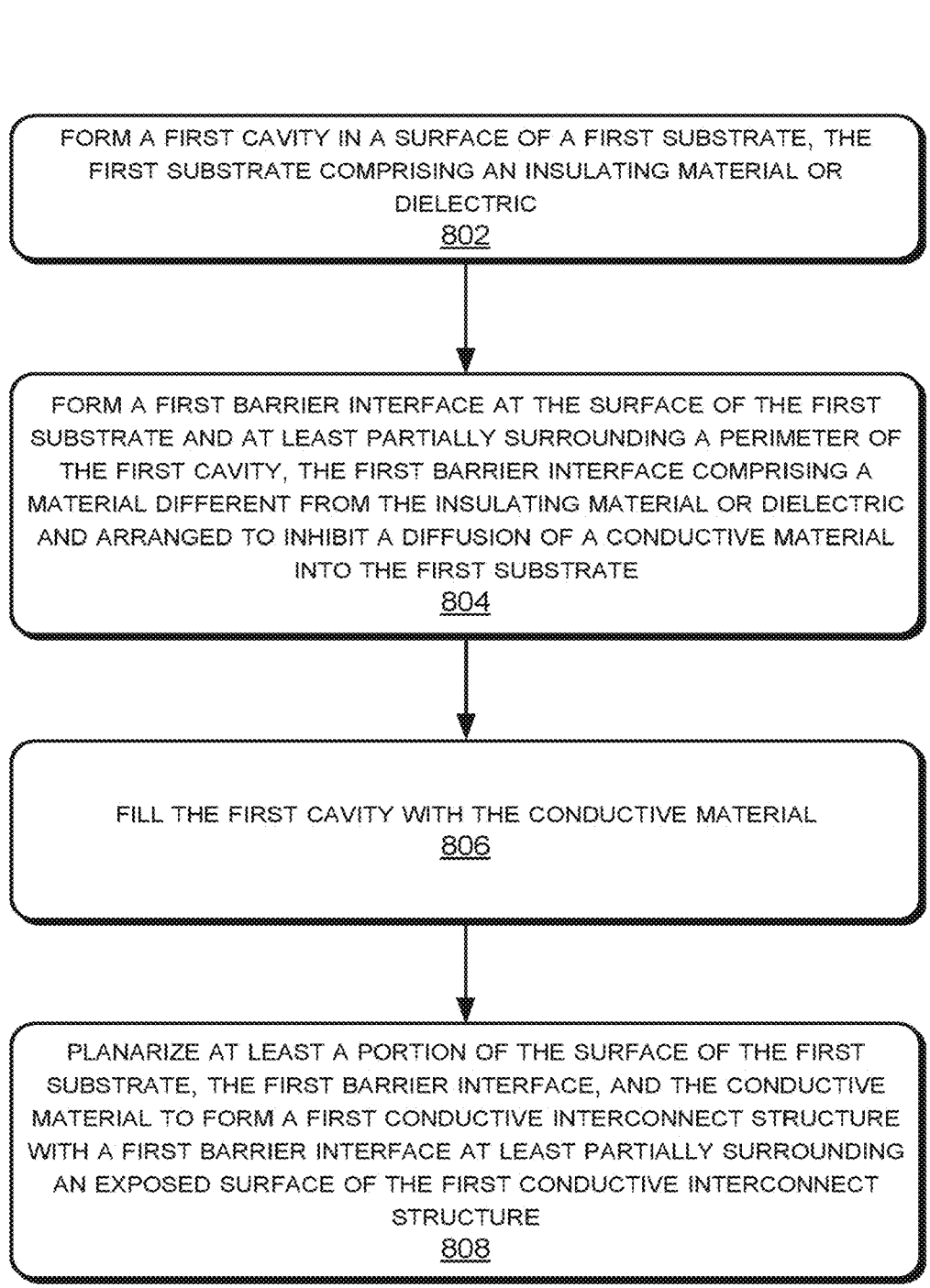
FIG. 8 is a flow diagram illustrating example processes for forming a microelectronic assembly comprising a pair of substrates with embedded conductive structures and a barrier interface, according to various embodiments.

FIG. 8 is a flow diagram describing an example process 800 of forming a microelectronic assembly (such as the microelectronic assembly 300) comprising a pair of substrates (such as the pair of substrates 102 and 104) with embedded conductive structures (such as conductive structures 106 and 108) and one or more barrier interfaces (such as barrier interface 302), according to an embodiment.

At block 802, the process includes forming a first cavity (or a plurality of first cavities) in a surface of a first substrate (such as substrate 102, for example). In an embodiment, the first substrate comprises an insulating material or dielectric, such as silicon oxide, or the like, which may be provided on a semiconductor base having circuitry on, in, through the base. At block 804, the process includes forming a first barrier interface (such as barrier interface 302, for example) at the first substrate and at least partially surrounding a perimeter of the first cavity. In an implementation, the process includes depositing a first barrier layer material onto at least a portion of a surface of the first cavity. The first barrier layer material may also be deposited onto at least a portion of the surface of the first substrate, particularly, partially or fully surrounding the first cavity. In an embodiment, the first barrier interface comprises a material different from the insulating material or dielectric and is arranged to inhibit a diffusion of a conductive material into the first substrate.

At block 806, the process includes filling the first cavity with the conductive material. In various embodiments, the conductive material comprises copper, a copper alloy, or like conductive material.

At block 808, the process includes planarizing at least a portion of the surface of the first substrate, the first barrier interface (including the first barrier layer material), and the conductive material to form a first conductive interconnect structure with a first barrier interface at least partially surrounding an exposed surface of the first conductive interconnect structure. In an embodiment, the first barrier interface is formed to have a predetermined width.

In an alternate implementation, the process includes depositing an additional layer of insulating material or dielectric (e.g., silicon oxide) onto the surface of the first substrate to improve the bonding surface of the substrate. For instance, the depositing may be used to fill any voids created during previous planarization steps, to flush the surface of the substrate with the barrier interface, or the like. In the implementation, the surface of the substrate is re-planarized after the depositing to form a flat, smooth, and flush bonding surface. The first barrier interface surrounds (at least partially) the conductive interconnect, and the insulating material or dielectric surrounds (at least partially) the first barrier interface.

In an implementation, the process includes forming a second cavity in a surface of a second substrate (such as substrate 104, for example), where the second substrate also comprises an insulating material or dielectric. The process includes forming a second barrier interface at the second substrate and at least partially surrounding a perimeter of the second cavity, where the second barrier interface comprises a material different from the insulating material or dielectric of the second substrate. In an implementation, the process includes depositing a second barrier layer material onto at least a portion of the surface of the second substrate and onto at least a portion of a surface of the second cavity.

The second barrier interface is arranged to inhibit a diffusion of the conductive material of the first conductive structure (embedded in the first substrate) into the second substrate. In an implementation, the process includes forming the first barrier interface and/or the second barrier interface to comprise a gas-filled gap. In another implementation, the process includes forming the first barrier interface and/or the second barrier interface to comprise a roughened area of the surface of the first substrate and/or the second substrate that inhibits bonding at the roughened area. In other embodiments, the first barrier interface and/or the second barrier interface comprises one or more of silicon nitride, silicon oxynitride, silicon carbide, silicon carbonitride, diamond, boron doped glass or oxide, aluminum oxide, or a like diffusion resistant material.

In the implementation, the process includes filling the second cavity with the conductive material and planarizing at least a portion of the surface of the second substrate, the second barrier interface, and the conductive material at the second substrate to form a second conductive interconnect structure (such as the conductive structure 108, for example) with a second barrier interface at least partly surrounding an exposed surface of the second conductive interconnect structure. In one example, the process includes forming the first barrier interface or the second barrier interface to have a width that is at least 10% of a diameter of the second conductive interconnect structure. In another example, the process includes forming the first barrier interface or the second barrier interface to have a width that is at least 20% of a diameter/width of the second conductive interconnect structure.

The process further includes directly bonding the surface of the second substrate to the surface of the first substrate without an adhesive material and mating the second conductive interconnect structure to the first conductive interconnect structure, such that any portion of the second conductive interconnect structure contacts the first barrier interface and not the first substrate and any portion of the first conductive interconnect structure contacts the second barrier interface and not the second substrate when the second conductive interconnect structure and the first conductive interconnect structure are offset or misaligned.

In an implementation, the process includes directly bonding the exposed surface of the second conductive interconnect structure to the exposed surface of the first conductive interconnect structure. In an example, the process includes high temperature annealing to bond the conductive structures into a single conductive interconnect.

Although various implementations and examples are discussed herein, further implementations and examples may be possible by combining the features and elements of individual implementations and examples.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A bonded structure comprising:
   a first substrate having a first bonding surface, the first substrate comprising:
   a first insulating layer having an upper surface extending parallel to a the first bonding surface;
   an embedded barrier layer disposed on and extending parallel to the first insulating layer without extending below the upper surface of the first insulating layer;
   a second insulating layer disposed on and extending parallel to the embedded barrier layer, an upper surface of the second insulating layer forming part of the first bonding surface; and
   a first contact pad extending through the second insulating layer, through the embedded barrier layer, and at least partially through the first insulating layer, and
   a second substrate having a second bonding surface, the second substrate including an insulating material and a second contact pad,
   wherein the first bonding surface is directly bonded to the second bonding surface, and the first contact pad is directly bonded to the second contact pad, at a bonding interface without an intervening adhesive.

2. The bonded structure of claim 1, wherein the second insulating layer comprises silicon and oxygen.

3. The bonded structure of claim 2, wherein the embedded barrier layer comprises one or more of silicon nitride, silicon oxynitride, silicon carbide, or silicon carbonitride.

4. The bonded structure of claim 2, wherein the embedded barrier layer comprises silicon carbonitride.

5. The bonded structure of claim 2, wherein the embedded barrier layer comprises silicon nitride.

6. The bonded structure of claim 1, further comprising a via extending from a lower surface of the first contact pad opposite the upper surface of the first contact pad.

7. The bonded structure of claim 1, wherein a width of the first contact pad is narrower than a width of the second contact pad at the bonding interface.

8. The bonded structure of claim 1, wherein the embedded barrier layer does not extend below the upper surface of the first insulating layer.

9. The bonded structure of claim 1, wherein the second insulating layer substantially covers the embedded barrier layer.

10. The bonded structure of claim 1, wherein the embedded barrier layer contacts a sidewall of the first contact pad.

11. The bonded structure of claim 10, wherein the first contact pad includes at least one sidewall lining layer surrounding copper.

12. The bonded structure of claim 11, wherein the at least one sidewall lining layer includes a layer comprising tantalum.

13. The bonded structure of claim 1, wherein:
the first substrate further comprises an additional contact pad extending through the second insulating layer, through the embedded barrier layer, and at least partially through the first insulating layer;
an upper surface of the additional contact pad forms part of the first bonding surface; and
the embedded barrier layer extends from the first contact pad to the additional contact pad.

14. A microelectronic assembly comprising:
a first substrate having a first bonding surface, the first substrate comprising:
a first insulating layer,
an embedded barrier layer disposed on the first insulating layer,
a bonding layer over the embedded barrier layer and partially defining the first bonding surface,
a first contact pad at least partially embedded in the bonding layer, the embedded barrier layer, and the first insulating layer, and
a second contact pad at least partially embedded in the bonding layer, the embedded barrier layer, and the first insulating layer,
wherein the bonding layer and the embedded barrier layer extend from the first contact pad to the second contact pad; and
a second substrate having a second bonding surface directly bonded to the first bonding surface without an intervening adhesive, the second substrate comprising:
a second insulating layer, and
a third contact pad at least partially embedded in the second insulating layer, the third contact pad directly bonded to the first contact pad without an intervening adhesive.

15. The microelectronic assembly of claim 14, wherein the embedded barrier layer extends across a width of the first substrate.

16. The microelectronic assembly of claim 14, wherein the embedded barrier layer surrounds and abuts perimeters of a group of contact pads including the first and second contact pads.

17. The microelectronic assembly of claim 14, wherein the embedded barrier layer extends across a contact pad region of the first substrate, and is surrounded by a zone free from the embedded barrier layer.

18. The microelectronic assembly of claim 14, wherein the embedded barrier layer surrounds and abuts perimeters of the first and second contact pads.

19. The microelectronic assembly of claim 14, wherein the first bonding surface and/or the second bonding surface comprises a nitrogen plasma treated surface.

20. The microelectronic assembly of claim 14, wherein the embedded barrier layer comprises a dielectric material different from the first insulating layer and from the bonding layer.

21. The microelectronic assembly of claim 14, wherein the first insulating layer and the second insulating layer comprise silicon oxide.

22. The microelectronic assembly of claim 14, wherein a width of the first contact pad is narrower than a width of the third contact pad.

23. The microelectronic assembly of claim 14, wherein the first insulating layer comprises silicon oxide material and a material of the third contact pad comprises copper or a copper alloy.

24. The microelectronic assembly of claim 14, wherein the first contact pad includes a barrier layer comprising tantalum surrounding a material comprising copper.

25. The microelectronic assembly of claim 14, wherein the second substrate further comprises a fourth contact pad laterally spaced from the third contact pad, and the fourth contact pad is directly bonded to the second contact pad without an intervening adhesive.

26. The microelectronic assembly of claim 14, wherein an upper surface of the embedded barrier layer is positioned closer to the first bonding surface than to a back side of the first contact pad.

27. The microelectronic assembly of claim 14, wherein the bonding layer comprises silicon and oxygen.

28. The microelectronic assembly of claim 14, wherein the embedded barrier layer comprises one or more of silicon nitride, silicon oxynitride, silicon carbide, or silicon carbonitride.

29. The microelectronic assembly of claim 28, wherein the embedded barrier layer comprises silicon nitride.

30. The microelectronic assembly of claim 28, wherein the embedded barrier layer comprises silicon carbonitride.

* * * * *